(12) United States Patent
Lin

(10) Patent No.: US 12,469,784 B1
(45) Date of Patent: Nov. 11, 2025

(54) UPSIZING BURIED POWER RAILS TO REDUCE POWER SUPPLY RESISTANCE AND BOOST CELL DENSITY SCALING

(71) Applicant: Synopsys, Inc., Mountain View, CA (US)

(72) Inventor: Xi Wei Lin, Fremont, CA (US)

(73) Assignee: SYNOPSYS, INC., Mountain View, CA (US)

( * ) Notice: Subject to any disclaimer, the term of this patent is extended or adjusted under 35 U.S.C. 154(b) by 51 days.

(21) Appl. No.: 17/385,703

(22) Filed: Jul. 26, 2021

Related U.S. Application Data

(60) Provisional application No. 63/057,598, filed on Jul. 28, 2020.

(51) Int. Cl.
   *H01L 23/528* (2006.01)
   *H01L 21/768* (2006.01)
   *H01L 23/532* (2006.01)
   *H10D 89/10* (2025.01)

(52) U.S. Cl.
   CPC .... *H01L 23/5286* (2013.01); *H01L 21/76816* (2013.01); *H01L 21/76883* (2013.01); *H01L 23/53209* (2013.01); *H10D 89/10* (2025.01)

(58) Field of Classification Search
   CPC ........... H01L 23/5286; H01L 21/76816; H01L 21/76883; H01L 23/53209; H01L 27/0207; H10D 89/10
   USPC ....................................................... 257/207
   See application file for complete search history.

(56) References Cited

U.S. PATENT DOCUMENTS

| | | | | |
|---|---|---|---|---|
| 10,833,003 | B1* | 11/2020 | Chou | H01L 29/41791 |
| 2007/0040188 | A1* | 2/2007 | Tsai | H01L 23/5329 257/E21.507 |
| 2007/0117375 | A1* | 5/2007 | Yang | H01L 21/76829 257/E21.577 |
| 2008/0099921 | A1* | 5/2008 | Katata | H01L 23/53238 438/653 |
| 2008/0311743 | A1* | 12/2008 | Cheng | H01L 21/76831 257/E21.241 |
| 2009/0072400 | A1* | 3/2009 | Zhu | H01L 21/76829 438/653 |
| 2011/0049594 | A1* | 3/2011 | Dyer | H01L 21/84 438/149 |
| 2012/0043592 | A1* | 2/2012 | Zhao | H01L 29/78 438/653 |
| 2016/0343825 | A1* | 11/2016 | Bae | H01L 21/76855 |
| 2018/0294267 | A1* | 10/2018 | Licausi | H01L 27/0924 |
| 2019/0189609 | A1* | 6/2019 | Chen | H01L 27/0924 |
| 2020/0027777 | A1* | 1/2020 | Sung | H01L 23/50 |
| 2020/0075456 | A1* | 3/2020 | Chanemougame | H01L 21/76807 |
| 2020/0373410 | A1* | 11/2020 | Lee | H01L 21/28568 |

* cited by examiner

*Primary Examiner* — Duy T Nguyen
(74) *Attorney, Agent, or Firm* — Jaquez Land Greenhaus & McFarland LLP; Bruce W. Greenhaus

(57) ABSTRACT

An integrated circuit comprising a substrate. At least two component bearing structures are fabricated within a layer above the substrate. In addition, at least one vertical space is present separating adjacent component bearing structures. At least one upsized buried power rail is formed within a corresponding cavity contiguously formed adjacent to a corresponding one of vertical spaces. The upsized buried power rail has a width that is greater than the width of the vertical space.

6 Claims, 12 Drawing Sheets

UPSIZING BURIED POWER RAILS TO REDUCE POWER SUPPLY RESISTANCE AND BOOST CELL DENSITY SCALING

CROSS-REFERENCE TO RELATED APPLICATIONS-CLAIM OF PRIORITY

The present application claims priority to U.S. Provisional Application No. 63/057,598, filed Jul. 28, 2020, entitled "Upsizing Buried Power Rails to Reduce Power Supply Resistance and Boost Cell Density Scaling", which is herein incorporated by reference in its entirety.

TECHNICAL FIELD

The present disclosure relates to an integrated circuit and associated method for fabricating an integrated circuit.

BACKGROUND

Integrated circuits are ubiquitous today. Almost every electronic device relies upon at least one and typically several integrated circuits. Integrated circuits typically have a plurality of electronic components fabricated in a substrate. Such components may include transistors, resistors, inductors and capacitors, to name a few. In some cases, the substrate is fabricated from silicon, however materials other than silicon can also be used as an alternative to silicon. However, for the sake of simplicity, the description of the integrated circuits discussed herein will refer to one particular example of an integrated circuit having transistors and a silicon substrate. Nonetheless, the discussion presented here applies equally well to other types of integrated circuits, i.e., integrated circuits that do not necessarily have transistors and/or which have a substrate fabricated from a material other than silicon.

In integrated circuits that have active components, such as transistors, proper operation requires power to be distributed and applied to the active components (e.g., the transistors). One common architecture for distributing power to the various active components of the integrated circuit is to fabricate "power rails" capable of carrying current from a power source to the active components. In some such cases, the power rails are "buried" in a lower layer of the integrated circuit beneath the layers of the integrated circuit in which the transistors are fabricated. In some cases, a conductive metal material is deposited into trenches formed between active components. The buried power rails formed in the trenches have a maximum width that is limited by the width of the opening of the trenches.

SUMMARY

An integrated circuit is disclosed that comprises a substrate; at least two component bearing structures fabricated within a layer above the substrate; at least one vertical space, each separating adjacent component bearing structures; and at least one upsized buried power rail, each formed within a corresponding cavity contiguously formed adjacent a corresponding one of the at least one vertical space, the upsized buried power rail having a width that is greater than the width of the corresponding vertical space.

The integrated circuit also comprises at least one buried power rail. Each of the buried power rails is formed within a corresponding cavity contiguously formed adjacent to a corresponding one of the vertical spaces. In some embodiments, the buried power rails have a width that is equal to the width of the corresponding vertical space.

In some embodiments, all of the buried power rails formed in the cavities are upsized buried power rails having a width that is greater than the width of the corresponding vertical space. In some embodiments, conductive path exists between at least one power contact point within at least one of the component bearing structures and at least one of the upsized buried power rails.

Some embodiments also have interconnecting electrical conductors fabricated in upper layers of the integrated circuit. In some embodiments, the interconnected electrical conductors are fabricated in layers above the component bearing structures.

Also disclosed is a method comprising: fabricating a substrate; fabricating component bearing structures over the substrate; forming at least one trench between at least a first component bearing structure and a second component bearing structure, the formation of each trench resulting in the formation of a corresponding vertical space between adjacent component bearing structures; and removing material to enlarge the width of a portion of at least one of the trenches to form an enlarged cavity and an adjacent vertical space.

In some embodiments, the cavity has precise sidewalls and facets. In some embodiments, the facets provide support for an overlying multi-layer stack formed in layers above the cavity. In some embodiments, the material is removed by an etch process. In some such embodiments, the etch process is a crystal etch. In some embodiments, the etch is performed using wet chemicals. In some such embodiments, the crystal etch is performed using potassium hydroxide. In some embodiments, an etching agent is introduced to start the etch process and the etch process is ended by implementing a cleaning process to remove the etching agent. Some embodiments of the method also comprise depositing an oxide coating over a lining of the interior of the cavity. Some embodiments also comprise applying a conductive material into at least one of the cavities. In some embodiments, the conductive material is a conductive metal material. Furthermore, in some embodiments, the width at the widest point in the cavity is approximately 50 nanometers. In some such embodiments, the width of the vertical space is approximately 30 nanometers. In some embodiments, the method further comprises removing top portions of the conductive material that are not needed in accordance with the integrated circuit design.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

When power is to be distributed throughout an integrated circuit design by a grid of buried power rails, restrictions on the width of the power rails can lead to undesirable amounts of power loss and variations in the voltage levels throughout the various points within the integrated circuit design. Increasing the width of the power rails can reduce the resistance between the end points of the power rails, but may not be practical due to the need to maintain the distance between components that lie above buried power rails and the manner in which the power rails are deposited. Aspects of the present disclosure relate to upsizing buried power rails to reduce power supply resistance and boost cell density scaling. This is done by etching below the layer on which the component structures of the integrated circuit are formed, thereby allowing the components of the design to remain spaced at the same distance as is the case for narrower buried power rails of conventional designs. By reducing the resistance along the buried power rails, the amount of power dissipated along the power rails is reduced and cell density scaling can be increased.

Figure 1:
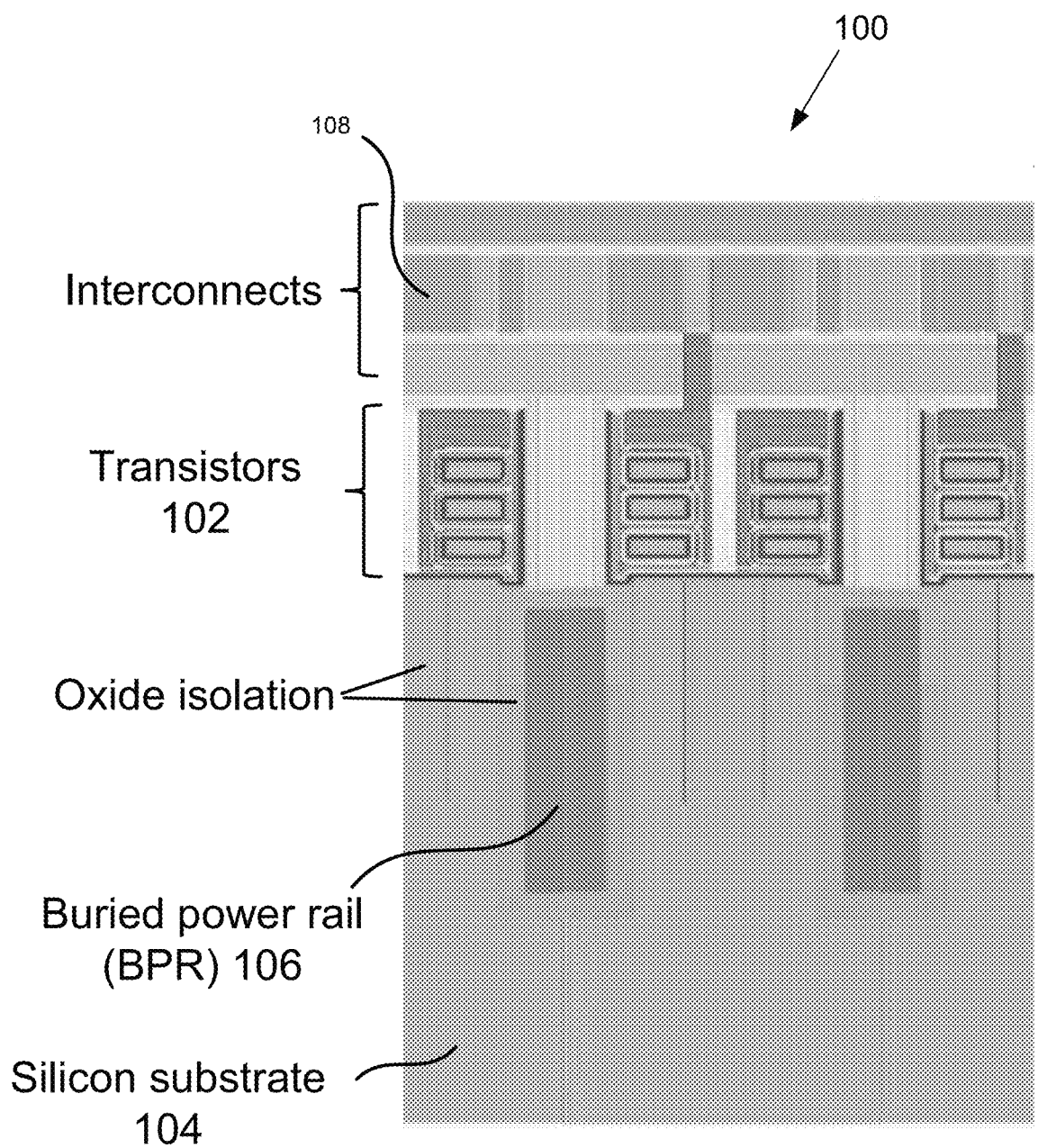
FIG. 1 is a simplified illustration of a cross-section of an integrated circuit in which transistors have been fabricated in a silicon substrate.

FIG. 1 is a simplified illustration of a cross-section of an integrated circuit 100 in which a substrate 104 has been fabricated. Component bearing structures, such as structures forming transistors 102, are fabricated over the silicon substrate 104. In integrated circuits in which the component bearing structures form active components, such as transistors, proper operation requires power to be distributed and applied to the active components (e.g., the transistors). One common architecture for distributing power to the various active components of the integrated circuit is to fabricate "power rails" 106 that are capable of carrying (i.e., conducting) current from a power source to the active components, such as nanosheet transistors 102. In some such cases, as in the case shown in the integrated circuit of FIG. 1, the power rails 106 are "buried" in a lower layer of the integrated circuit 100 beneath the layers of the integrated circuit in which the transistors 102 are fabricated. A conductive path (not shown) is formed between at least one power contact point of each active component and at least one of the buried power rails. In this way, a grid of power distribution conductors is fabricated that allows power to be distributed to the active components of the integrated circuit without interfering with the component bearing structures above which form the components of the integrated circuit 100. In addition, interconnecting electrical conductors 108 can be fabricated in upper layers (i.e., above the layer in which the transistors 102 are fabricated). The interconnecting conductors allow the various components of the integrated circuit to be electrically interconnected to form the relevant circuit structures.

Figure 2:
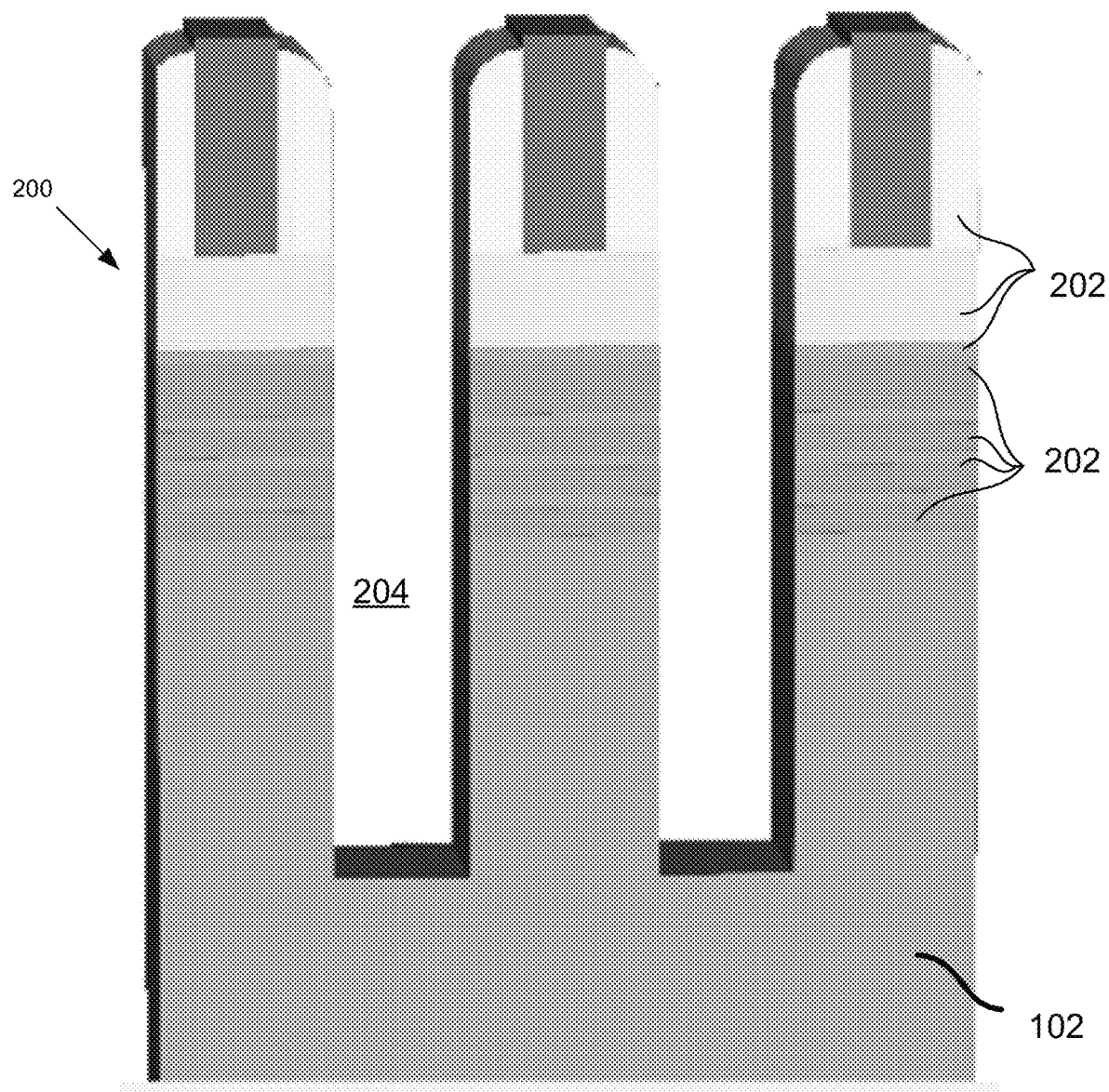
FIG. 2 illustrates a cross sectional view of a structure at one point in the process of fabricating an integrated circuit.

FIG. 2 illustrates a cross sectional view of a structure 200 at one point in the process of fabricating an integrated circuit 100. At this point, the silicon substrate 102 has been formed as the base on which other layers 202 are formed from various materials. Two "trenches" 204 have been formed, such as by etching into the silicon substrate 102. The particular materials of the other layers 202 depend on the function and structure of the components to be formed in the integrated circuit 100.

Figure 3:
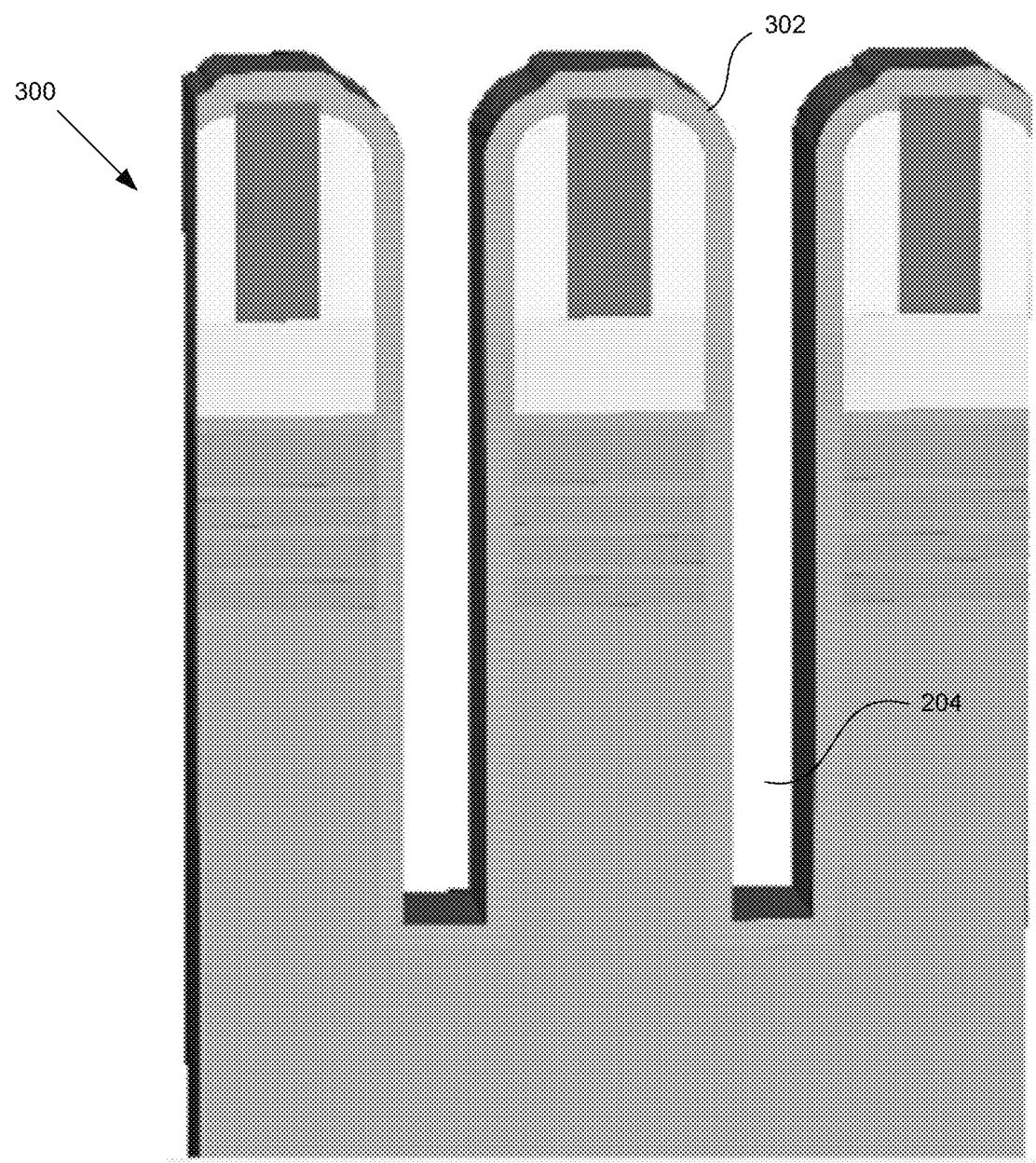
FIG. 3 illustrates a cross section of the structure at a second point in the fabrication process.

FIG. 3 illustrates a cross section of the structure 300 at a next point in the fabrication process. At this point, an oxide isolation coating 302 is deposited over the top of the structure 200 that was previously formed.

Figure 4:
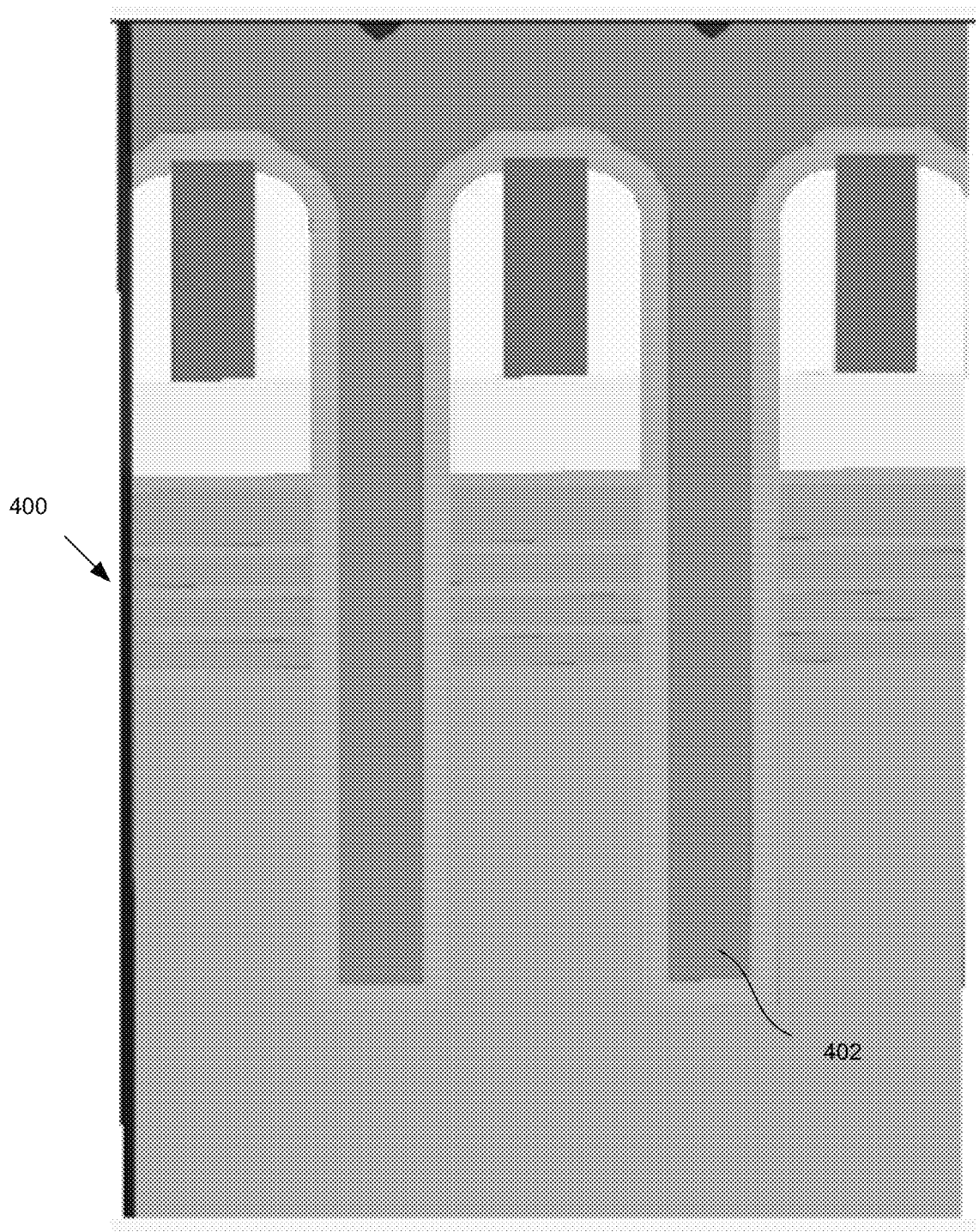
FIG. 4 illustrates a cross section of the structure at a third point in the fabrication process.

FIG. 4 illustrates a cross section of the structure 400 at a next point in the fabrication process. At this point, a conductive metal material 402 is deposited into the trenches 204 of the structure 400.

Figure 5:
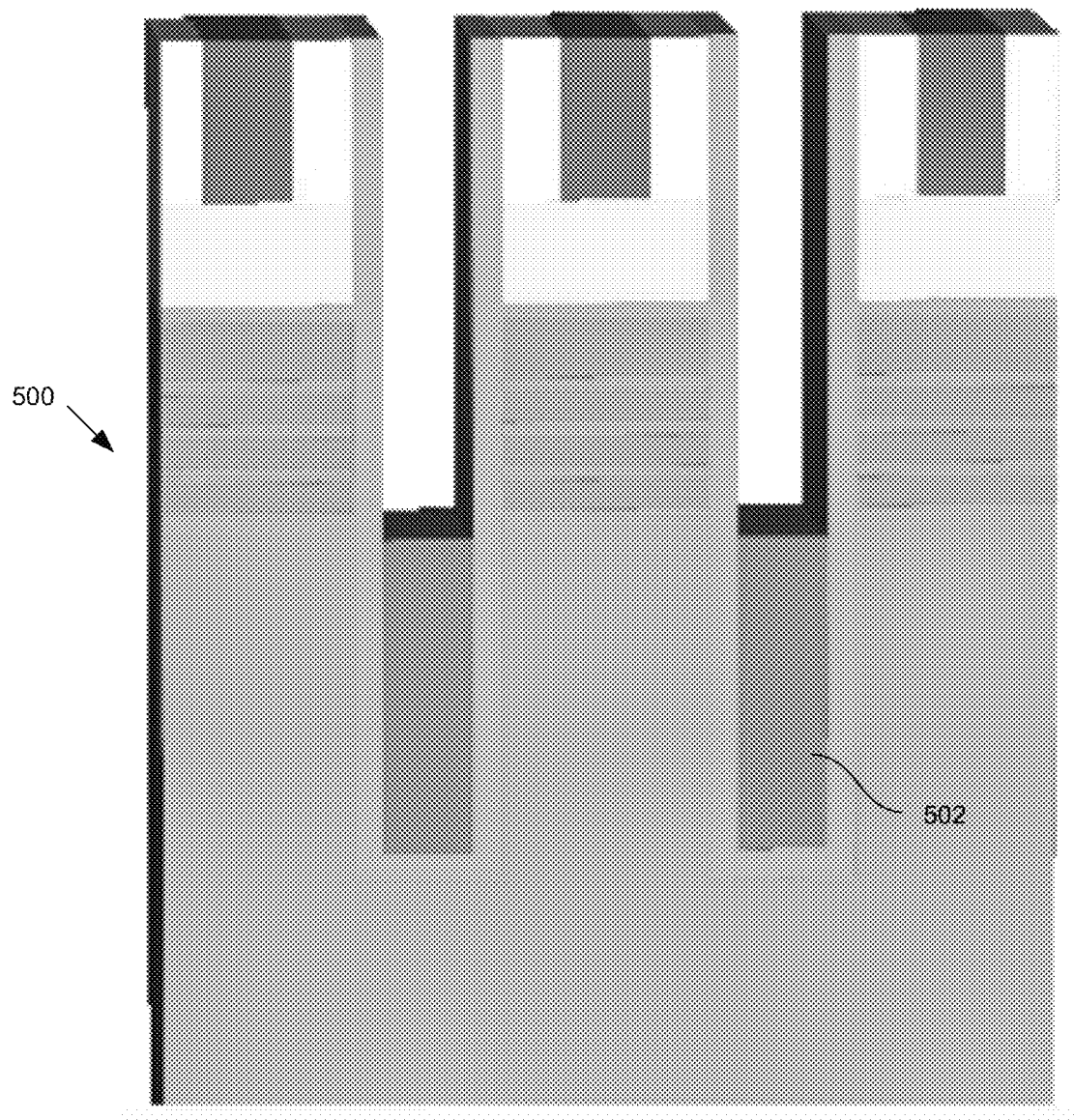
FIG. 5 illustrates a cross section of the structure at a fourth point in the fabrication process.

FIG. 5 illustrates a cross section of the structure 500 at a next point in the fabrication process. At this point, an etch is performed to remove the top portions of the conductive metal material 402 that are not needed in the structure 500. The remaining conductive metal material 502 forms buried power rails for the integrated circuit 100.

Figure 6:
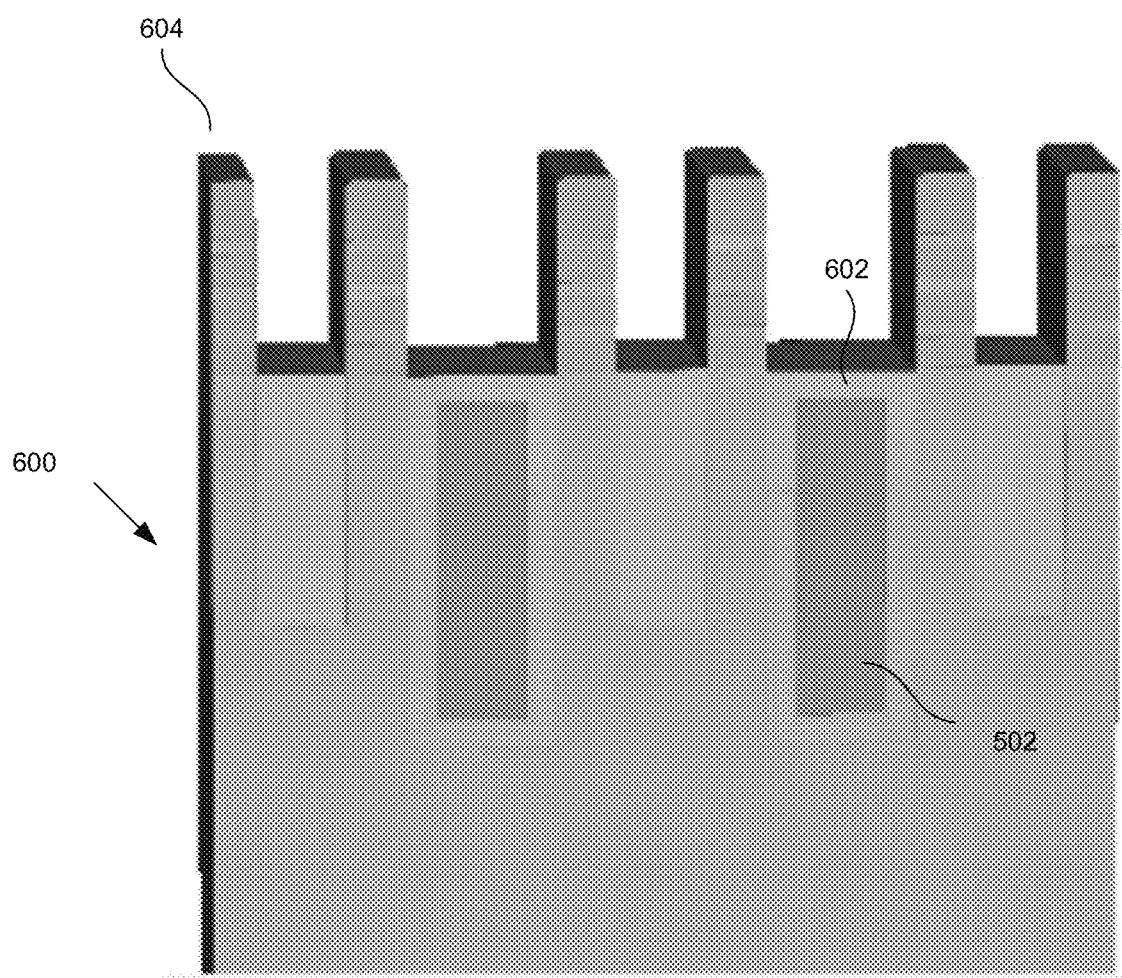
FIG. 6 illustrates a cross section of the structure at a fifth point in the fabrication process.

FIG. 6 illustrates a cross section of the structure 600 at a next point in the fabrication process. At this point, transistor patterning is performed by removing the portions of the structure 500 that are not used in the final integrated circuit. In addition, an insulating material 602 is placed over the remaining conductive metal material 502 and between transistor structures 604, except at points (not shown) at which power is to be applied to the transistors formed above the buried power rail. Additional process steps (not shown) are then performed to form the remaining interconnections 108 and other features of the integrated circuit 100. It can be seen that the buried power rails 106 formed from the remaining conductive metal material 502 have a maximum width that is limited by the width of the opening of the trenches 204.

Figure 7:
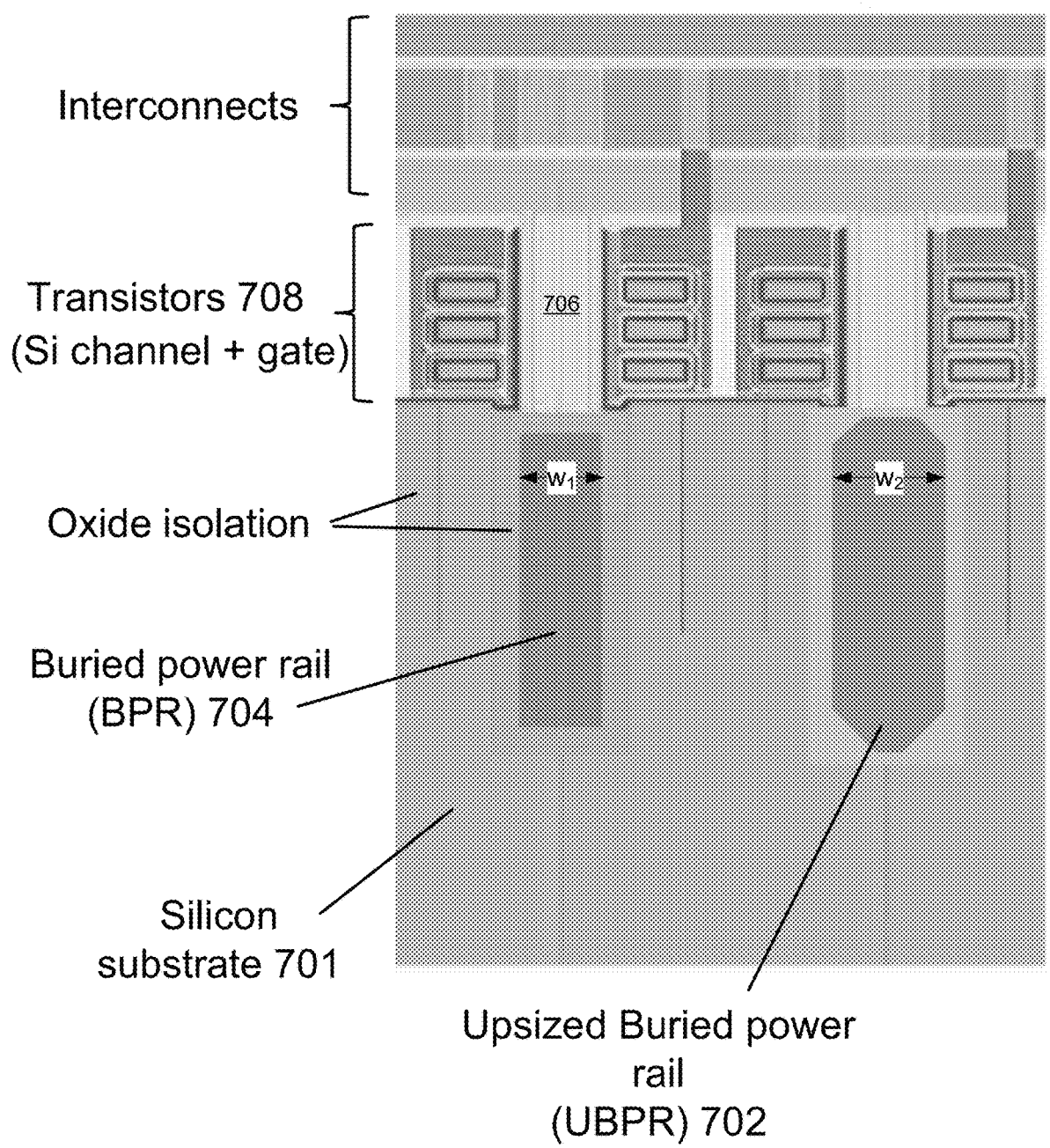
FIG. 7 is an illustration of a cross section of an integrated circuit in which a first of two shown power rails is a conventional buried power rail (BPR) and a second of the two shown power rails is an upsized buried power rail (UBPR) in accordance with the disclosed apparatus, formed by the disclosed method.

FIG. 7 is an illustration of a cross section of an integrated circuit 700 in which a first of two shown power rails is a conventional buried power rail (BPR) 704 and a second of the two shown power rails is an upsized buried power rail (UBPR) 702 in accordance with the disclosed apparatus formed by the disclosed method. A substate 701 forms a base upon which other layers reside. The width $W_2$ of the UBPR 702 is greater than the width $W_1$ of the BPR 704. Typically, although not necessarily, all power rails would be formed as UBPRs, however in order to demonstrate the difference between the width $W_1$ of the BPR 704 and the width $W_2$ of the UBPR 702, the integrated circuit 700 is shown to have both a BPR 704 and a UBPR 702.

The process for fabricated an IC with UBRPs starts the same as the process used to fabricate an integrated circuit with conventional BPRs. That is, the structure 200 (see FIG. 2) that is formed during the process of fabricating an integrated circuit with convention BPRs is identical to the structure that is fabricated in the early stages of the process of fabricating an integrated circuit having UBPRs. In some embodiments, trenches 204 are formed between the layers 202 in which component bearing structures are formed that will be later used to form nanosheet transistors of an integrated circuit having UBPRs. The trenches 204 form vertical spaces 706 between adjacent component bearing structures (e.g., the transistors 708 to be formed above the substrate 701 and UBPR 702).

Figure 8:
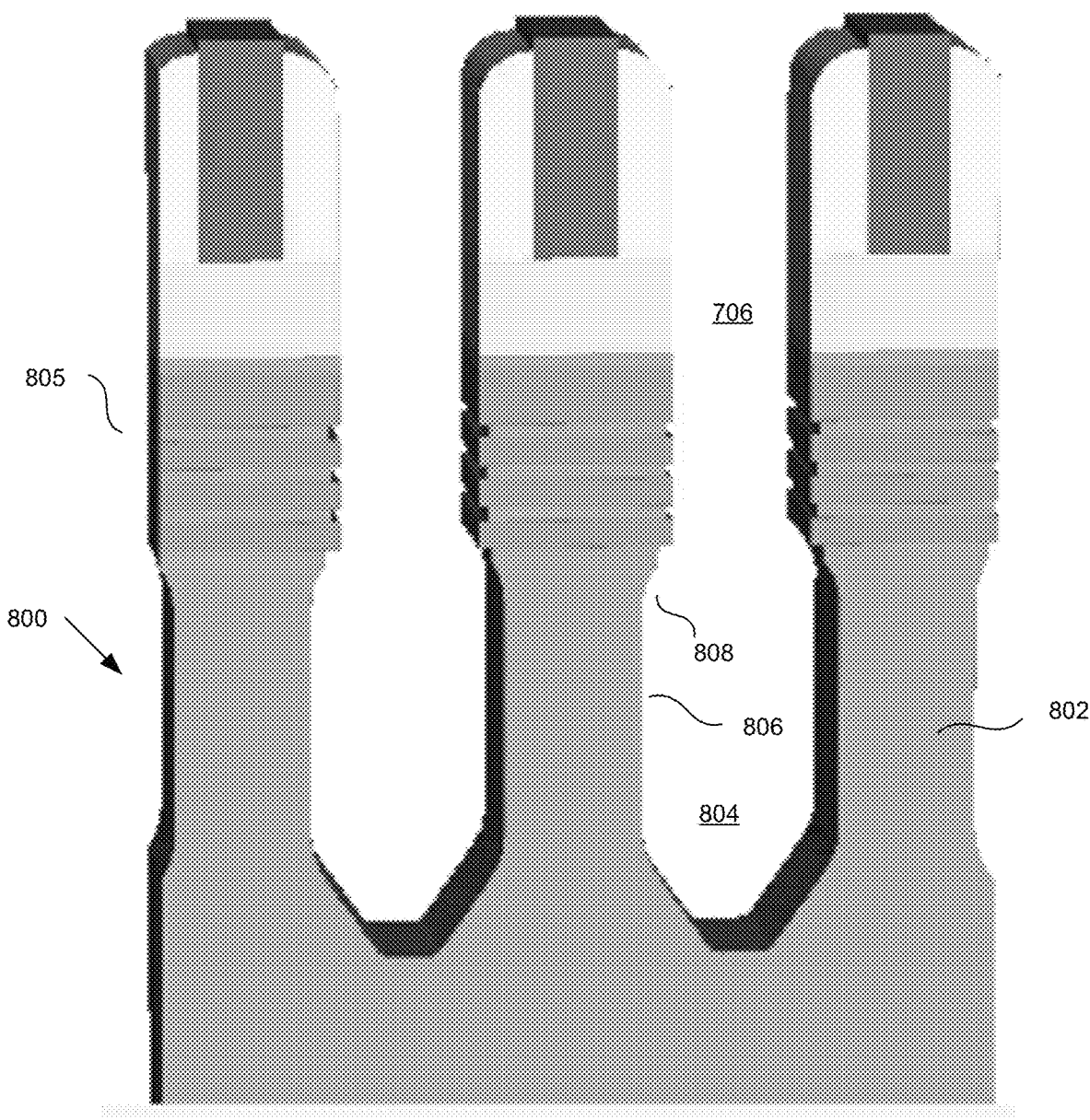
FIG. 8 illustrates a cross sectional view of a structure at the 2nd point in the process of fabricating an integrated circuit having UBRPs.

FIG. 8 illustrates a cross sectional view of a structure 800 at the next point in the process of fabricating an integrated circuit having UBRPs. Material is removed to enlarge a portion 804 of at least one of the trenches 204 to form an enlarged cavity 804. The result of removing the material is the formation of enlarged cavities 804, one in each trench 204, each cavity 804 adjacent an associated vertical space 706. In some embodiments, an etch, such as a crystal etch, of the silicon substrate 802 is performed in order to enlarge the width of the portion 804 of the trench 204 (see FIG. 2). These cavities 804 will then be prepared to allow material forming buried power rails to be deposited within them. In one embodiment, etching of the trenches is done by a crystal etch using wet chemicals, such as potassium hydroxide (KOH), commonly known as caustic potash. In some embodiments, the crystal etch is controlled by ending the etch after a tightly controlled duration of time. In some embodiments, this is done by implementing a cleaning process to remove the etching agent (e.g., the KOH) from the cavity 804 at the desired time. Other etching agents may be used as well to perform crystal etching. In addition, some agents that perform etching that would not be or may not be characterized as a "crystal etch" may be used. For example, while crystal etch tends to yield faceted silicon surfaces allowing the UBPR width to be better controlled, another embodiment uses an etch process with plasma to isotopically etch the silicon and enlarge the cavity. However, an isotropic etch does not necessarily produce faceted silicon surfaces and may be harder to control than a crystal etch process. In embodiments in which a crystal etch is used, the crystal etch provides accurate control over the cavity width, resulting in a cavity 804 having precise sidewall surfaces 806 on the sides of the cavity 804 and facets 808 on the tops of the cavity 804. That is, the sidewalls 806 have dimensions that are very accurate and in accordance with the design criteria desired. The facets 808 provide support for an overlying Silicon/SiGe multilayer stack formed in the component bearing structures 805 above the silicon substrate 802. The crystal etch does not interfere with the subsequent processing, and so is readily integrated into an otherwise conventional process.

Figure 9:
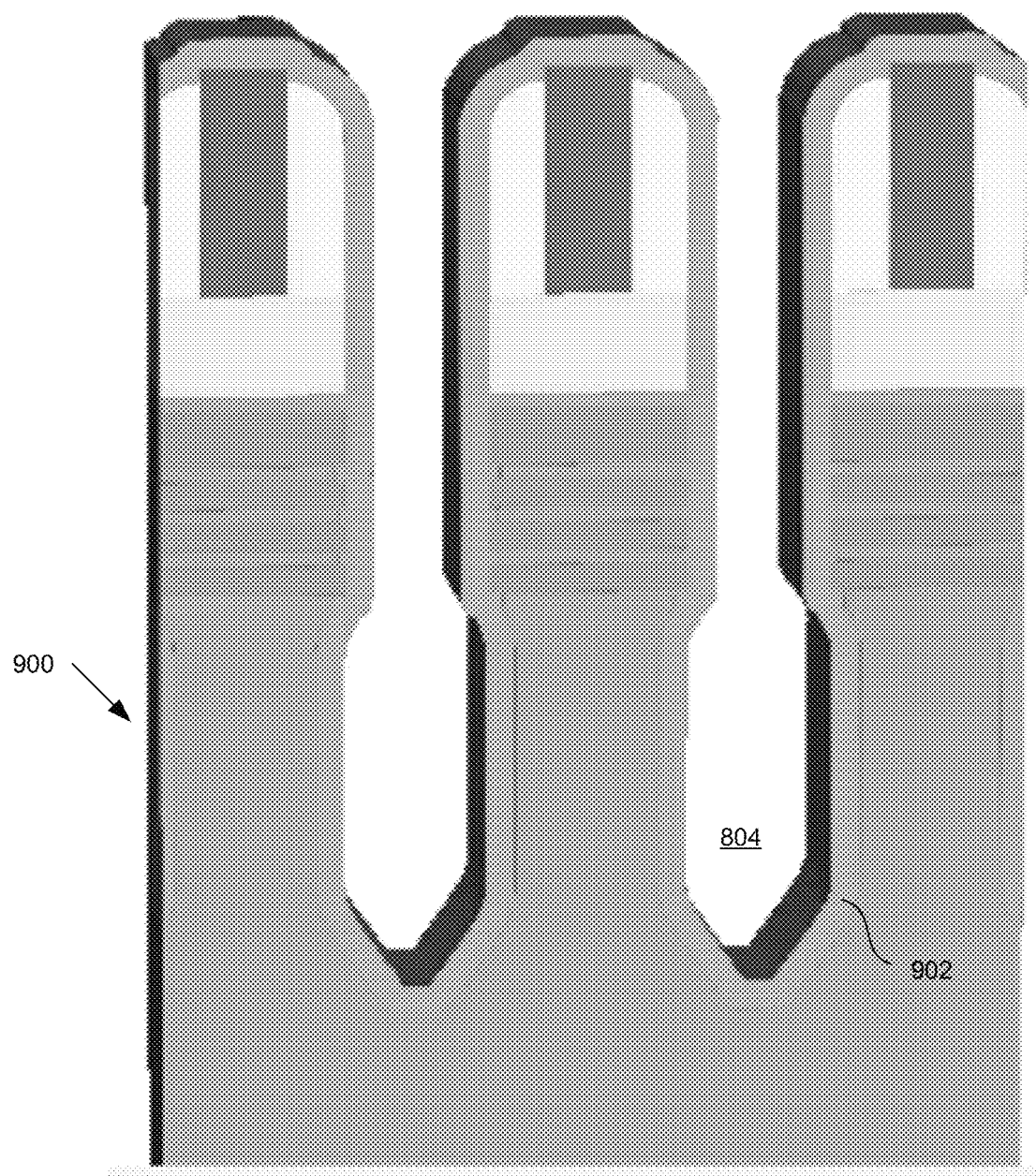
FIG. 9 illustrates a cross section of the structure at a $3^{rd}$ point in the fabrication process.

FIG. 9 illustrates a cross section of the structure 900 at a next point in the fabrication process. At this point, similar to the process performed on the structure 300 shown in FIG. 3, an oxide isolation coating 902 is deposited over the top of the structure 800 that was previously formed, including lining the interior of the cavity 804.

Figure 10:
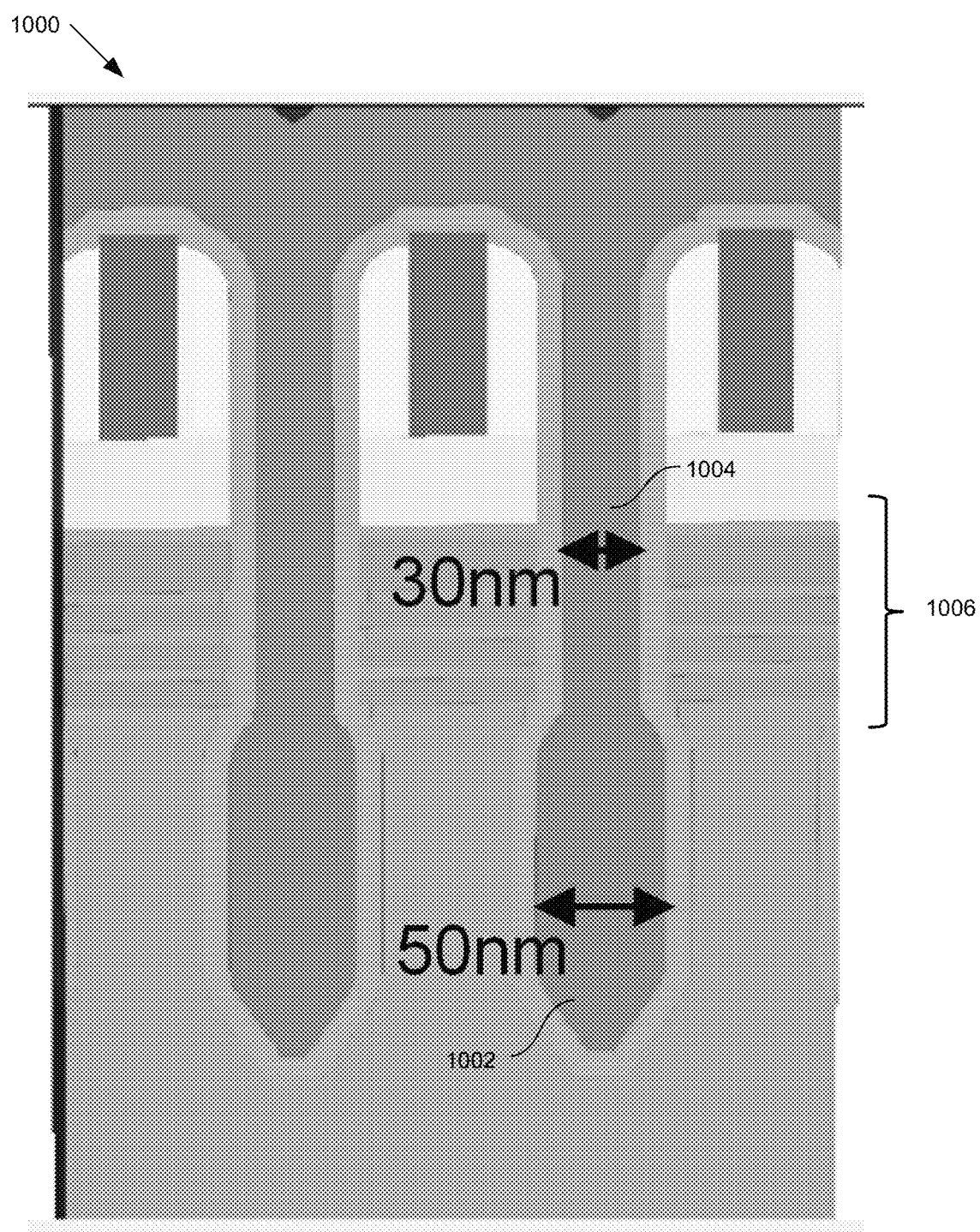
FIG. 10 illustrates a cross section of the structure at a $4^{th}$ point in the fabrication process.

FIG. 10 illustrates a cross section of the structure 1000 at a next point in the fabrication process. At this point, a conductive material (e.g., a conductive metal material) 1002 is applied (e.g., deposited) into the cavities 804 of the structure 900. In one embodiment, the width of the conductive metal material 1002 at the widest point in the cavity is approximately 50 nanometers. The width of the conductive metal material 1002 along the region 1004 between the layers 1006 in which structures, such as transistors, will be fabricated (i.e., the vertical space) is approximately 30 nanometers.

Figure 11:
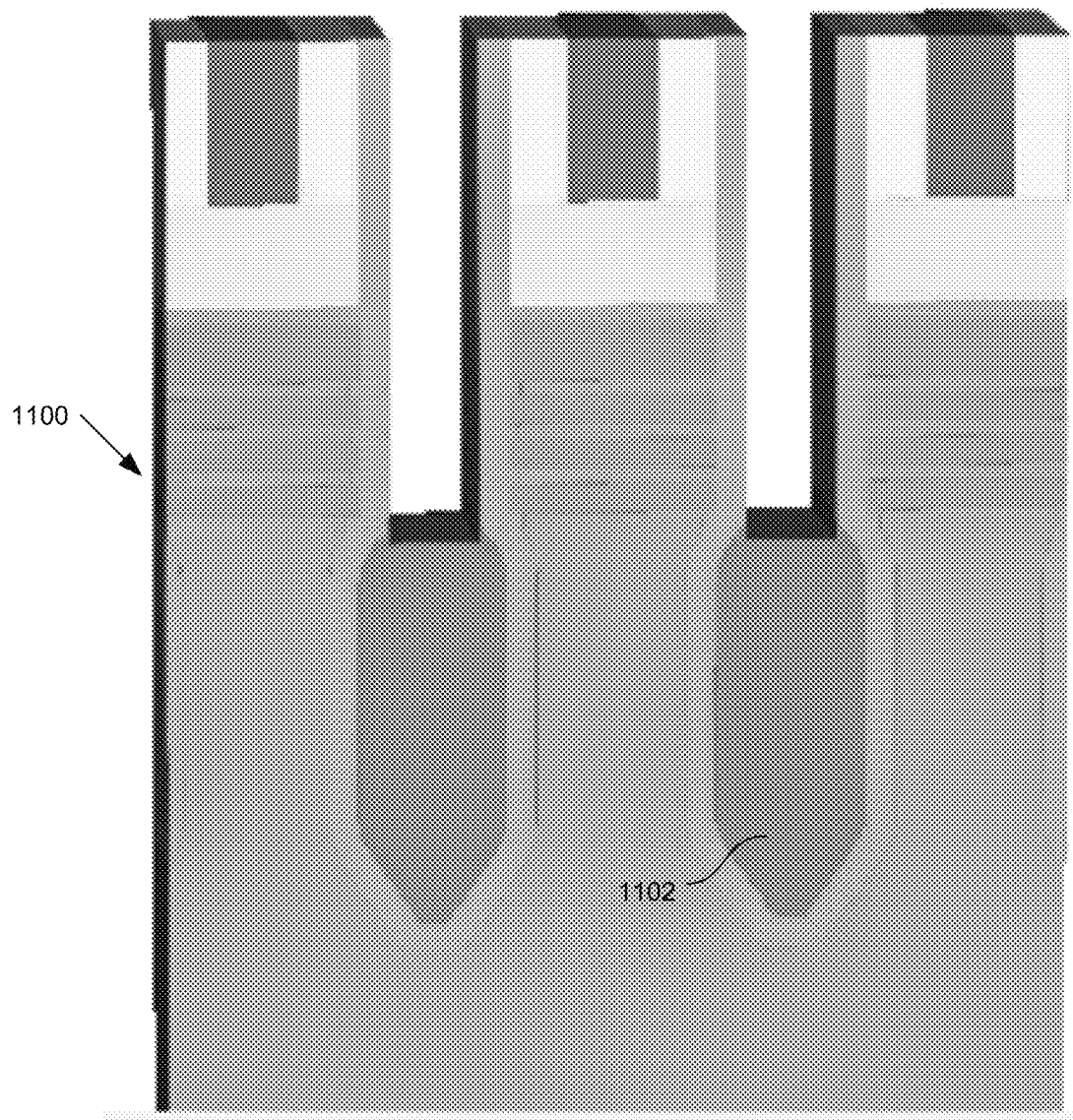
FIG. 11 illustrates a cross section of the structure at a $5^{th}$ point in the fabrication process.

FIG. 11 illustrates a cross section of the structure 1100 at a next point in the fabrication process. At this point, an etch is performed to remove the top portions of the conductive metal material 1002 (see FIG. 10) that are not needed in the structure 1100 (i.e., not needed in accordance with the integrated circuit design). The remaining conductive metal material 1102 forms the UBPRs for the integrated circuit.

Figure 12:
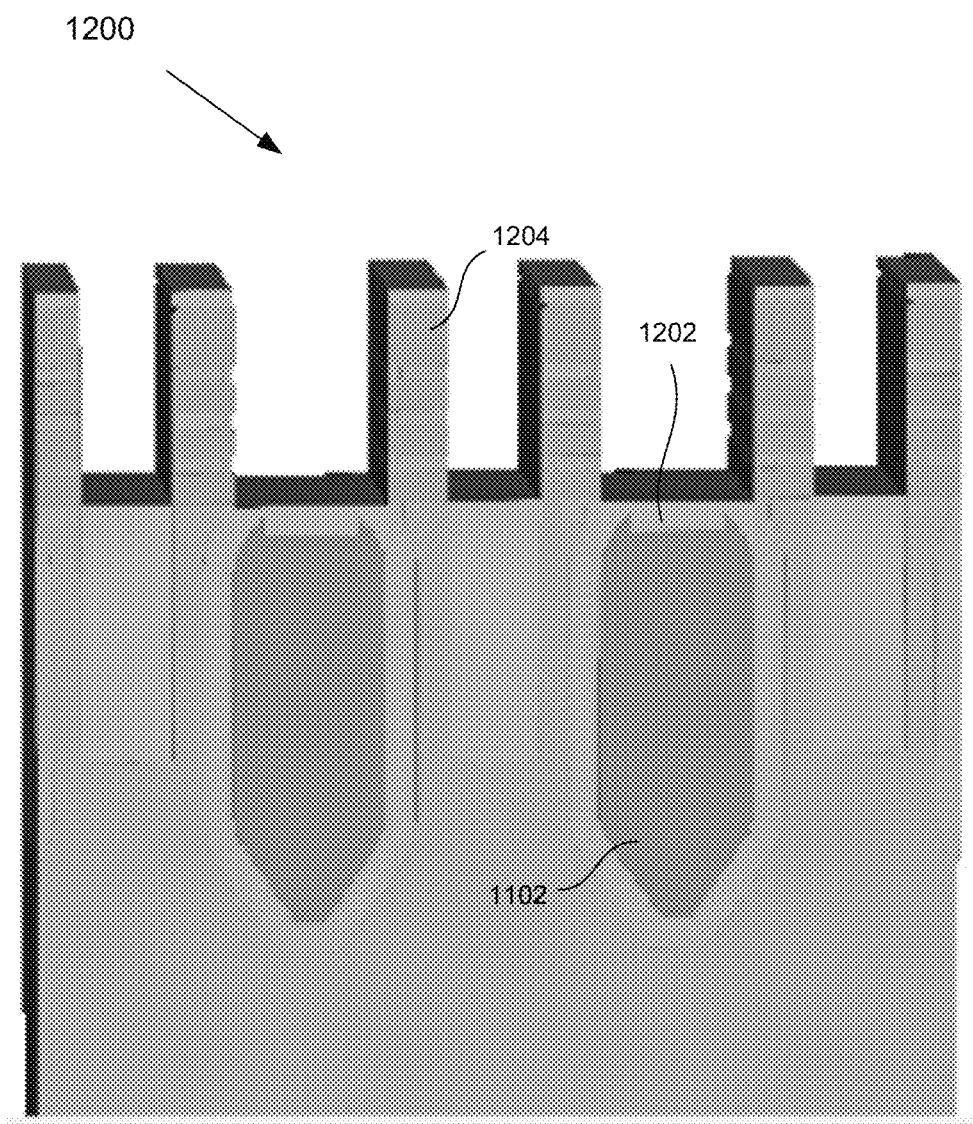
FIG. 12 illustrates a cross section of the structure at a $6^{th}$ point in the fabrication process.

FIG. 12 illustrates a cross section of the structure 1200 at a next point in the fabrication process. At this point, transistor patterning is performed by removing the portions of the structure 1100 that are not used in the final integrated circuit. In addition, an insulating material 1202 is placed over the remaining conductive metal material 1102 and between transistor structures 1204, except at points (not shown) at which power is to be applied to the transistors formed above the UBPR formed from the remaining conductive metal material 1102. Additional process steps (not shown) are then performed to form the remaining interconnections 108 and other features of the integrated circuit 100.

It can be seen that the UBPRs formed from the remaining conductive metal material 1102 have a maximum width that is not limited by the width of the opening of the trenches 204. By using an etch to create cavities 804 below the layers 1006 (see FIG. 10) in which the components, such as transistors 1204, are fabricated the UBPRs 1102 can have widths that are substantially greater than the width of the openings between the trenches 204. Accordingly, the effective resistance of a UBPR 1102 can be significantly reduced by laterally expanding its width beneath transistors without affecting the transistor footprint. Reducing the power rail resistance provides better power supply, less voltage drop, and less power connection (tapping) at place & route level, thus improving design routability and overall chip design area.

In some embodiments, etching results in an increase in width of the UBPR from 30 nm to 50 nm with respect to the BPR. It will be understood by those skilled in the art that the width of the trench between transistors and the width of the UBPR after the etch to form the cavity will be a function of the particular fabrication process used to fabricate the integrated circuit, as well as the etching agent and the duration of the etch. The increase in the width from 30 nm to 50 nm results in a reduction of approximately 70% in the resistance through the power distribution grid. A further reduction in the resistance through the power grid is possible by increasing the amount of crystal etching (i.e., increasing the width of the cavity resulting from the crystal etch).

In the foregoing disclosure, implementations of the disclosure have been described with reference to examples of specific implementations. It will be evident that various modifications may be made to the disclosed examples of implementations without departing from the broader spirit and scope of implementations of the disclosure as set forth in the claims that follow. Where the disclosure refers to some elements in the singular tense, more than one element can be depicted in the figures and like elements are labeled with like numerals. The disclosure and drawings are to be regarded in an illustrative sense rather than a restrictive sense.

What is claimed is:

1. An integrated circuit comprising:
   a substrate supporting components of the integrated circuit;
   at least two component bearing structures fabricated within a layer above the substrate;
   at least one vertical space at least partially filled with an insulation material and having a width taking the entire space separating adjacent component bearing structures, wherein each of the at least two component bearing structures include a portion of an electrical component that is conductive, the at least one vertical space being devoid of electrical components that conduct electricity; and
   at least one upsized buried power rail, each formed within a corresponding cavity contiguously formed adjacent to a corresponding one of the at least one vertical space, the at least one upsized buried power rail having a width that is greater than a width of the corresponding vertical space, the at least one upsized buried power rail being buried between (1) an interface of a top of the substrate and (2) a bottom of the substrate, the at least one upsized buried power rail being located between the corresponding vertical space and at least a portion of the substrate, with the corresponding vertical space being located directly above the at least one upsized buried power rail.

2. The integrated circuit of claim 1, further comprising at least one buried power rail, each of the at least one buried power rail formed within a corresponding cavity contiguously formed adjacent a corresponding one of the at least one vertical space, the at least one buried power rail having a width that is equal to a width of the corresponding vertical space.

3. The integrated circuit of claim 1, further comprising at least one buried power rail that is not an upsized buried power rail, that has a width that is not greater than a width of a corresponding vertical space.

4. The integrated circuit of claim 3, further comprising interconnecting electrical conductors fabricated in upper layers of the integrated circuit.

5. The integrated circuit of claim 4, wherein the interconnecting electrical conductors are fabricated in layers above the at least two component bearing structures.

6. The integrated circuit of claim 1, wherein the at least one upsized buried power rail includes multiple buried power rails that are upsized buried power rails, formed in trenches in the substrate, and the multiple buried power rails have widths that are greater than widths of corresponding vertical spaces;

the integrated circuit having a cross-section that includes cross-sections of each of the multiple buried power rails, the cross-section of each the multiple buried rails has a height and a width of one of the multiple buried rails, the cross sections of the multiple buried rails each has a non-rectangular shape.

* * * * *